(12) United States Patent
Oike

(10) Patent No.: US 11,181,650 B2
(45) Date of Patent: Nov. 23, 2021

(54) SCINTILLATOR PLATE, RADIATION IMAGING APPARATUS, AND METHOD OF MANUFACTURING SCINTILLATOR PLATE

(71) Applicant: CANON KABUSHIKI KAISHA, Tokyo (JP)

(72) Inventor: Tomoyuki Oike, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 110 days.

(21) Appl. No.: 16/683,986

(22) Filed: Nov. 14, 2019

(65) Prior Publication Data

US 2020/0081141 A1 Mar. 12, 2020

Related U.S. Application Data

(63) Continuation of application No. PCT/JP2018/017223, filed on Apr. 27, 2018.

(30) Foreign Application Priority Data

Jun. 15, 2017 (JP) .............................. JP2017-117886

(51) Int. Cl.
*G01T 1/202* (2006.01)
*C23C 14/06* (2006.01)
*C23C 14/22* (2006.01)

(52) U.S. Cl.
CPC ........ *G01T 1/2023* (2013.01); *C23C 14/0694* (2013.01); *C23C 14/225* (2013.01)

(58) Field of Classification Search
CPC ... G01T 1/2023; G01T 1/2002; G01T 1/2018; G01T 1/202; G01T 1/2012; G01T 1/20; C23C 14/0694; C23C 14/225

See application file for complete search history.

(56) References Cited

U.S. PATENT DOCUMENTS 7,482,602 B2 1/2009 Shoji et al.
8,084,782 B2 12/2011 Oike et al.
(Continued)

FOREIGN PATENT DOCUMENTS

JP 5407140 2/2014
JP 5407140 B2 2/2014
(Continued)

OTHER PUBLICATIONS

International Search Report in International Application No. PCT/JP2018/017223 (dated Jul. 2018).

*Primary Examiner* — David P Porta
*Assistant Examiner* — Fani Boosalis
(74) *Attorney, Agent, or Firm* — Venable LLP

(57) ABSTRACT

A scintillator plate provided with a scintillator having, on a substrate, a first surface facing the substrate and a second surface on an opposite side to the first surface is provided. The scintillator includes needle-like crystals each containing an alkali metal halide compound, thallium iodide, and copper and/or silver as an additive element. The additive element is contained in the second surface at a concentration of not less than 0.04 mol % and not more than 0.5 mol %, and has a higher concentration in the first surface than in the second surface. A thickness of a largest portion of each of the needle-like crystals becomes not less than one time and not more than nine times a thickness at a height of 10 μm in a direction from the first surface to the second surface.

12 Claims, 4 Drawing Sheets

(56) References Cited

U.S. PATENT DOCUMENTS

| | | |
|---|---|---|
| 8,574,955 B2 | 11/2013 | Oike et al. |
| 9,223,035 B2 | 12/2015 | Isa et al. |
| 9,720,104 B2 | 8/2017 | Nagata et al. |
| 9,880,292 B2 | 1/2018 | Chiyoma et al. |
| 9,964,652 B2 | 5/2018 | Chiyoma et al. |
| 10,007,004 B2 | 6/2018 | Chiyoma et al. |
| 2016/0223689 A1* | 8/2016 | Nagata .................... G01T 1/202 |
| 2019/0146101 A1 | 5/2019 | Oike et al. |

FOREIGN PATENT DOCUMENTS

| | | |
|---|---|---|
| JP | 2015-021886 | 2/2015 |
| JP | 2015-021886 A | 2/2015 |
| JP | 2016-085164 | 5/2016 |
| JP | 2016-085164 A | 5/2016 |
| JP | 2016-095189 A | 5/2016 |
| WO | 2013/089015 A1 | 6/2013 |
| WO | WO 2013/089015 | 4/2015 |
| WO | 2018/230182 A1 | 12/2018 |

\* cited by examiner

FIG. 6

| | SUBSTRATE TEMPERATURE | ADDITIVE ELEMENT | CONCENTRATION [mol%] SECOND SURFACE (FIRST SURFACE) | FILM THICKNESS [μm] | CRYSTAL DIAMETER [μm] MAXIMUM THICKNESS | CRYSTAL DIAMETER [μm] FIRST SURFACE SIDE (10 μm HEIGHT) | INCREASE RATIO [TIMES] | MTF RELATIVE VALUE | LUMINANCE RELATIVE VALUE |
|---|---|---|---|---|---|---|---|---|---|
| FIRST EXAMPLE | 70°C; AFTER DEPOSITION: 150°C HEATING | Cu | 0.28 | 795 | 2.1 | 0.30 | 7.0 | 133 | 129 |
| SECOND EXAMPLE | 70°C; AFTER REMOVAL: 160°C | Cu | 0.24 | 777 | 3.5 | 0.40 | 8.8 | 137 | 155 |
| THIRD EXAMPLE | RT; MAXIMUM TEMPERATURE: 150°C | Cu | 0.04 | 513 | 2.2 | 0.30 | 7.3 | 135 | 143 |
| FOURTH EXAMPLE | RT | Ag | 0.42 | 464 | 3.0 | 0.58 | 5.2 | 163 | — |
| FIRST COMPARATIVE EXAMPLE | 40°C | NO | — | 837 | 1.7 | 1.2 | 1.4 | 100 | 100 |
| SECOND COMPARATIVE EXAMPLE | 130°C | NO | — | 853 | 9.5 | 1.0 | 9.5 | 89 | 129 |
| THIRD COMPARATIVE EXAMPLE | 40°C | Cu | 1.22 (2.24) | 764 | 0.40 | 0.16 | 2.5 | 131 | 9.5 |
| FOURTH COMPARATIVE EXAMPLE | 130°C | Cu | 0.17 | 556 | 40 | 1.0 | 40 | 45 | 120 |

SCINTILLATOR PLATE, RADIATION IMAGING APPARATUS, AND METHOD OF MANUFACTURING SCINTILLATOR PLATE

CROSS-REFERENCE TO RELATED APPLICATIONS

This application is a Continuation of International Patent Application No. PCT/JP2018/017223, filed Apr. 27, 2018, which claims the benefit of Japanese Patent Application No. 2017-117886, filed Jun. 15, 2017, both of which are hereby incorporated by reference herein in their entirety.

BACKGROUND OF THE INVENTION

Field of the Invention

The present invention relates to a scintillator plate, a radiation imaging apparatus, and a method of manufacturing the scintillator plate.

Background Art

As a flat panel detector (FPD) used for radiation imaging in medical image diagnosis, non-destructive inspection, and the like, there is available an indirect conversion FPD that converts radiation transmitted through an object into light by a scintillator and detects light emitted from the scintillator by a light-receiving element. A needle-like crystal group of an alkali metal halide compound such as cesium iodide is widely used for a scintillator that converts radiation into light to efficiently transfer emitted light to a light-receiving element. A needle-like crystal group has gaps formed between the respective needle-like crystals and repeats total reflection of light in the crystals due to the difference in refractive index between the crystals and air, thereby effectively guiding the emitted light to the light-receiving element.

PTL 1 discloses that when a scintillator is formed by vapor deposition, a substrate is placed above a vapor deposition source of a scintillator material in the vertical direction obliquely with respect to the vertical axis to form thin needle-like crystals and improve the resolution characteristics of the scintillator. PTL 2 discloses that the emission luminance of a scintillator is improved by using a raw material containing a plurality of activator agents with different melting points with respect to cesium iodide.

CITATION LIST

Patent Literature

PTL 1: International Publication No. 2013/089015
PTL 2: Japanese Patent No. 5407140

The present invention has as its object to provide a technique advantageous in improving the resolution and luminance characteristics of a scintillator.

SUMMARY OF THE INVENTION

According to some embodiments, a scintillator plate provided with a scintillator having, on a surface of a substrate, a first surface facing the surface and a second surface on an opposite side to the first surface, wherein the scintillator includes a plurality of needle-like crystals each containing an alkali metal halide compound as a base material, thallium iodide as an activator agent, and at least one of copper and silver as an additive element, the additive element is contained in the second surface at a concentration of not less than 0.04 mol % and not more than 0.5 mol %, the additive element has a higher concentration in the first surface than in the second surface, and a thickness of a largest portion of each of the needle-like crystals in a plane parallel to the surface becomes not less than one time and not more than nine times a thickness of the needle-like crystal in a plane parallel to the surface at a height of 10 μm in a direction from the first surface to the second surface, is provided.

According to some other embodiments, a method of manufacturing a scintillator plate, wherein the method comprises: a preparation step of preparing a vapor deposition material by mixing cesium iodide with an additive element material in an amount of not less than 0.1 wt % and not more than 0.3 wt % with respect to the cesium iodide; and a vapor deposition step of forming a scintillator by vapor-depositing the vapor deposition material on a substrate, wherein the additive element material includes at least one of copper iodide, copper bromide, silver iodide, and silver bromide, and in the vapor deposition step, a temperature of the substrate at the time of starting vapor deposition is not more than 100° C., and a temperature of the substrate at the time of finishing vapor deposition is not less than 50° C. and not more than 200° C., is provided.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a view showing the characteristics of the scintillators according to the examples and comparative examples of the present invention.

DESCRIPTION OF THE EMBODIMENTS

Specific embodiments of a radiation imaging apparatus according to the present invention will be described below with reference to the accompanying drawings. Note that radiation according to the present invention can include not only α-rays, β-rays, and γ-rays that are beams generated by particles (including photons) emitted by radioactive decay but also beams having energy equal to or more than the energy of these beams, for example, X-rays, particle rays, and cosmic rays.

Figure 1:
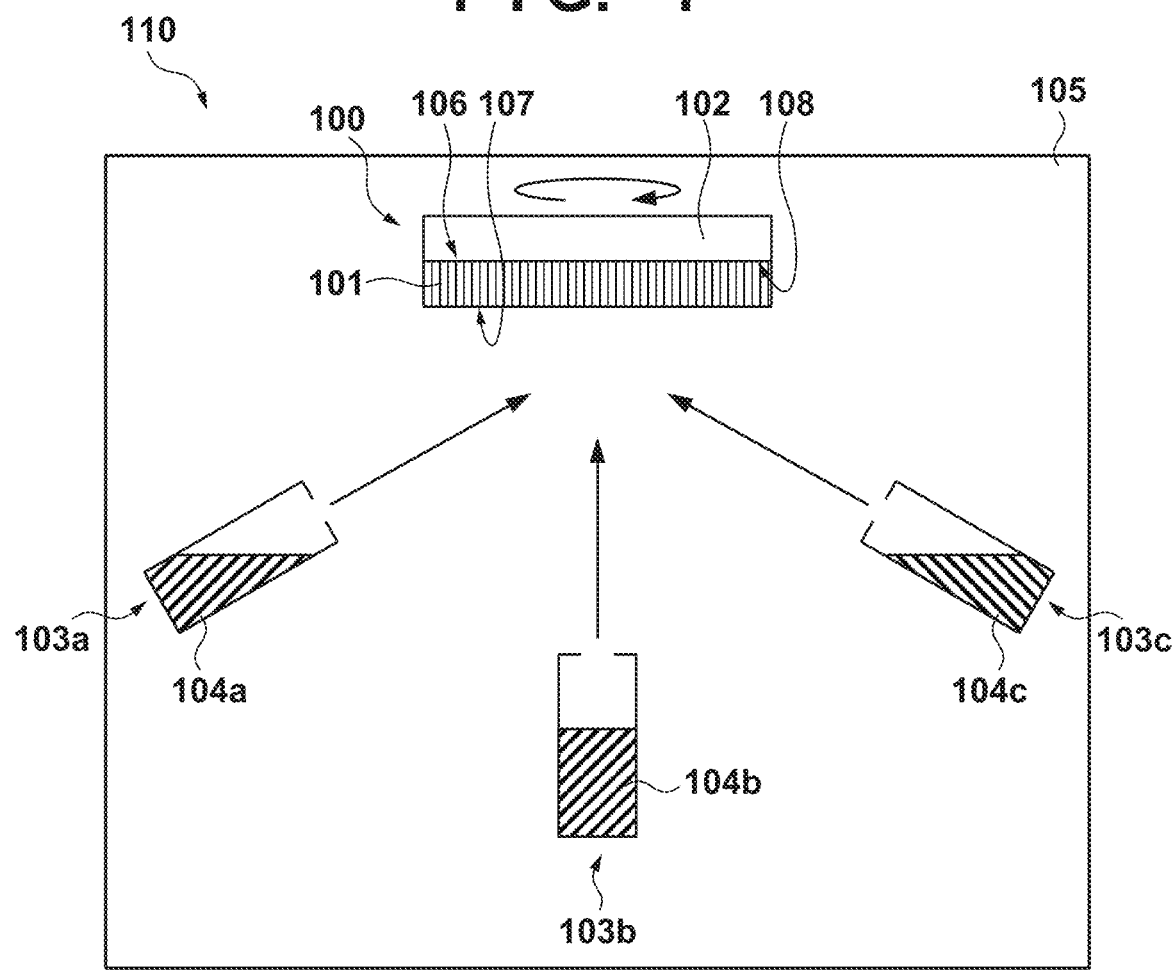
FIG. 1 is a view showing an example of the arrangement of an apparatus that forms a scintillator according to an embodiment of the present invention.

The arrangements of a scintillator plate and radiation imaging apparatus and a manufacturing method according to an embodiment of the present invention will be described with reference to FIGS. 1 to 6. FIG. 1 is a view showing an example of the arrangement of a deposition apparatus 110 for forming a scintillator plate 100 having a scintillator 101 according to this embodiment. As shown in FIG. 1, the scintillator plate 100 includes a material supply source 103 and a substrate 102 for depositing the scintillator 101, which are arranged in a chamber 105 that can be evacuated to a vacuum. The scintillator plate 100 is formed by forming the scintillator 101 on a surface 108 of the substrate 102 by using a deposition method such as a vapor deposition method. The scintillator 101 has a first surface 106 facing the surface 108 of the substrate 102 and a second surface 107 on the opposite side to the first surface 106. A plurality of vapor deposition materials 104 (to be described later) may be stored in one material supply source 103 and vapor-deposited. Alternatively, vapor deposition materials 104a to 104c may be respectively stored in different material supply sources 103a to 103c and vapor-deposited, as shown in FIG. 1.

In this embodiment, the scintillator 101 includes a plurality of needle-like crystals formed from an alkali metal halide compound as a base material using thallium iodide as an activator agent. As an alkali metal halide compound that can form needle-like crystals, for example, cesium iodide, cesium bromide, or the like can be selected. The embodiment uses thallium iodide as an activator agent, containing 0.2 mol % or more and 3.2 mol % or less of thallium with respect to the entire scintillator 101. This makes the thallium function as an emission center to achieve sufficient light emission.

In this embodiment, the needle-like crystals of the scintillator 101 contain at least one additive element among copper and silver. The second surface 107 of the scintillator 101 contains an additive element at a concentration of 0.04 mol % or more and 0.5 mol % or less. The additive element may be only copper or silver or may include both copper and silver. As an additive element material for adding an additive element to the scintillator 101, a single metal such as copper or silver may be used or a compound containing copper or silver, such as copper iodide, copper bromide, silver iodide, or silver bromide.

The vapor deposition materials 104 including an alkali metal halide compound, thallium iodide, and additive element material may be respectively stored in the different material supply sources 103 and used for vapor deposition. In addition, materials having similar melting points can be mixed and stored in the same material supply source 103 and vapor-deposited. For example, when cesium iodide (melting point: 621° C.) and copper iodide (melting point: 605° C.) are respectively selected as a base material and an additive element material, the cesium iodide and the copper iodide as an additive element mixed at a predetermined concentration may be stored in one material supply source 103 and vapor-deposited. Alternatively, cesium iodide (melting point: 621° C.) as a base material and silver iodide (melting point: 552° C.) as an additive element material mixed at a predetermined concentration may be stored in one material supply source 103 and vapor-deposited.

Figure 5:
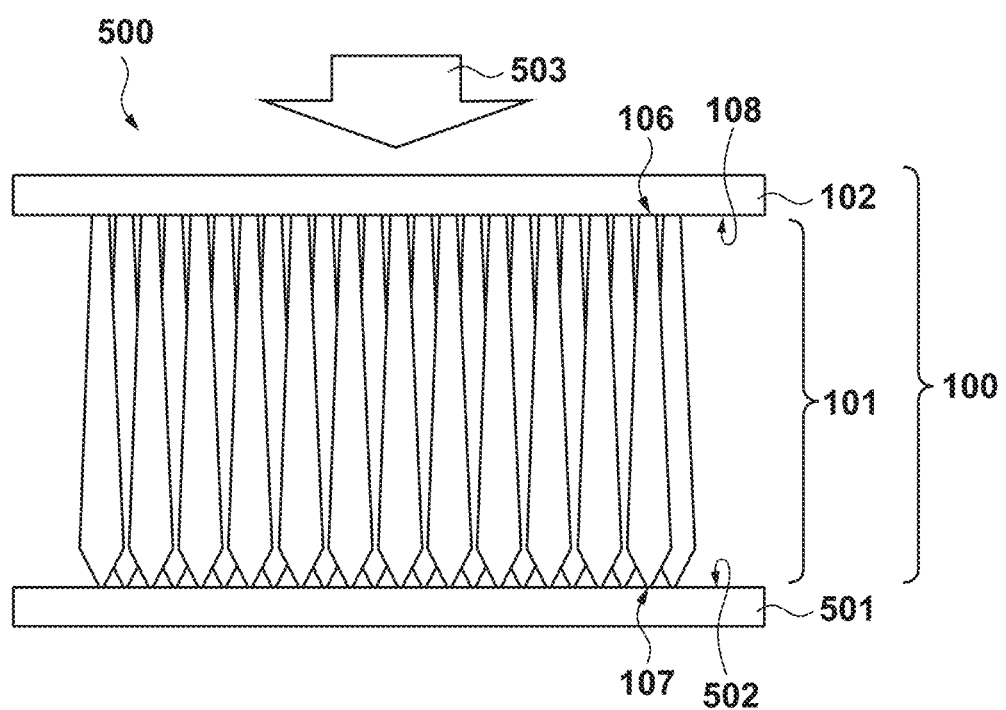
FIG. 5 is a view showing an example of the arrangement of a radiation imaging apparatus using the scintillator according to the embodiment of the present invention.

When an alkali metal halide compound and an additive element material are mixed in advance and vapor-deposited, the melting point of the additive element material is lower than that of the alkali metal halide compound. For this reason, the concentration of the additive element contained in the scintillator 101 is high in an early stage of deposition, and becomes low in a later stage of deposition. That is, the concentration of the additive element in the first surface 106 of the scintillator 101 is higher than that in the second surface 107. As a result, even when an additive element causes coloring of the scintillator 101, which causes light absorption, the following arrangement of the radiation imaging apparatus can prevent attenuation of emitted light from the scintillator 101. This makes it possible to easily guide light to the sensor panel. FIG. 5 shows the arrangement of a radiation imaging apparatus using the scintillator plate 100 according to this embodiment. In the radiation imaging apparatus 500, the scintillator plate 100 can be of an indirect type in which the scintillator 101 is placed alongside a light-receiving surface 502 of a sensor panel 501, and the substrate 102 is placed on a side away from the light-receiving surface 502. In the radiation imaging apparatus 500, in order to make the light-receiving surface 502 sufficiently receive light emitted by the scintillator 101, the concentration of an additive element in the second surface 107 of the scintillator 101 is controlled to be as low as 0.04 mol % or more and 0.5 mol % or less with respect to the scintillator 101. This can suppress the influence of coloring caused by the additive element and a reduction in efficiency in receiving light on the light-receiving surface 502 of the sensor panel 501. As shown in FIG. 5, radiation 503 may be caused to enter the sensor panel 501 from the scintillator plate 100 or from the opposite side to the scintillator plate 100.

As described above, an alkali metal halide compound and an additive element material are mixed in advance and then vapor-deposited. In this case, the concentration of the additive element in the scintillator 101 can gradually and continuously increase from the second surface 107 of the scintillator 101 to the first surface 106. In contrast to this, an alkali metal halide compound and an additive element material may be vapor-deposited without being mixed. In this case, the material supply source 103 in which the additive element material is stored may be controlled to continuously or stepwisely increase the concentration of the additive element from the second surface 107 of the scintillator 101 to the first surface 106. For example, the opening degree of the shutter, the temperature, and the like of the material supply source 103 in which an additive element material is stored as the vapor deposition material 104 are controlled. This makes it possible to continuously or stepwisely control the concentration of the additive element contained in the scintillator 101 from the first surface of the scintillator 101 in an early stage of deposition to the second surface in a later stage of deposition.

In order to efficiently transfer light emitted by the scintillator 101 to the sensor panel 501, it is important to improve the waveguide characteristics of the needle-like crystals in the longitudinal direction from the first surface 106 of the scintillator 101, which faces the substrate 102, to the second surface 107. For this purpose, it is important to control changes in the thickness (diameter) of each needle-like crystal itself in a direction parallel to the surface 108 of the substrate 102 and the thickness (diameter) of each needle-like crystal in the film thickness direction. In general, in an early stage of a vapor deposition step for each cesium iodide needle-like crystal as an alkali metal halide compound, a minute crystal nucleus (initial nucleus) is formed on a substrate. In addition, properly selecting a substrate temperature, pressure, and deposition rate will make the crystal nucleus preferentially grow in the <100> azimuth into a needle-like crystal. In a later stage of deposition (on the second surface 107), the thickness of the crystal nucleus increases more in the direction parallel to the surface 108 of the substrate 102. Accordingly, in order to improve the resolving power of the scintillator, it is required to thin the needle-like crystal and suppress an increase in the size of the needle-like crystal. When the scintillator 101 is to be deposited by vapor deposition, supplying an additive element in the above manner can improve the crystallinity of each needle-like crystal in an early stage of deposition, in particular, and more reduce the thickness of the needle-like crystal in the direction parallel to the surface 108 of the substrate 102. On the other hand, reducing the concentration of the additive element in the second surface 107 of the scintillator 101 can suppress the attenuation of emitted light caused by the additive element.

In order to improve the waveguide characteristics, it is necessary to reduce a change in the thickness of each needle-like crystal in the direction parallel to the surface 108 of the substrate 102 between an early stage of the deposition of the needle-like crystal and a later stage of the deposition. For this reason, the thickness of the largest portion of each needle-like crystal in a plane parallel to the surface 108 of the substrate 102 is set to one or more times and nine or less times the thickness of the needle-like crystal in a plane parallel to the surface 108 of the substrate 102 at a height of 10 μm in the direction from the first surface 106 to the second surface 107. As indicated by the examples and comparative examples described later, making a change (increase ratio) in the thickness of the scintillator 101 in a plane parallel to the surface 108 of the substrate 102 fall within the above range can satisfy both requirements for resolving power (resolution) and luminance. In addition, the thickness of the largest portion of each needle-like crystal can be 4 μm or less. The thickness of the largest portion of the needle-like crystal may be smaller than the size of each light-receiving element arranged in the sensor panel 501.

Figure 2:
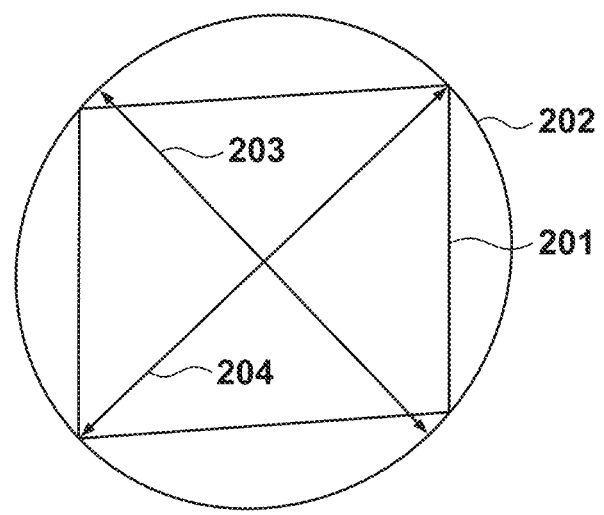
FIG. 2 is a view showing a method of measuring the diameter of the scintillator according to the embodiment of the present invention.

As shown in FIG. 2, the thickness (diameter) of each needle-like crystal of the scintillator 101 may be the length of a major axis 204 of an ellipse 202 of the needle-like crystal of the scintillator 101 which has the minimum area and encloses a plane 201 parallel to the surface 108 of the substrate 102. The thickness (diameter) of each needle-like crystal of the scintillator 101 may also be the dimeter of a circle of the needle-like crystal of the scintillator 101 which circumscribes the plane 201 parallel to the surface 108 of the substrate 102. The evaluation of the thickness of each needle-like crystal of the scintillator 101 or a change in the thickness of the needle-like crystal can be measured by, for example, observing the shape of the second surface 107 or a side surface of the scintillator 101 with a scanning electron microscope (SEM) or the like. Referring to FIG. 2, the ellipse 202 has a minor axis 203.

Figure 3:
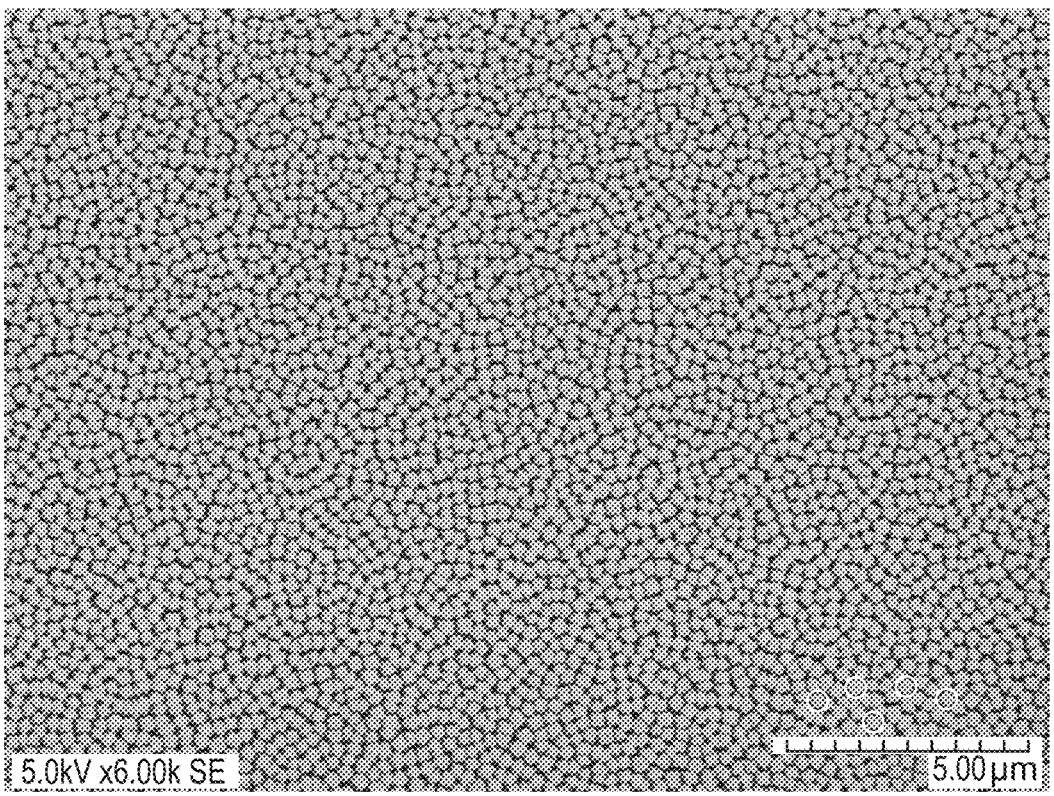
FIG. 3 is a view showing an observation image of a surface of the scintillator according to the embodiment of the present invention.
Figure 4:
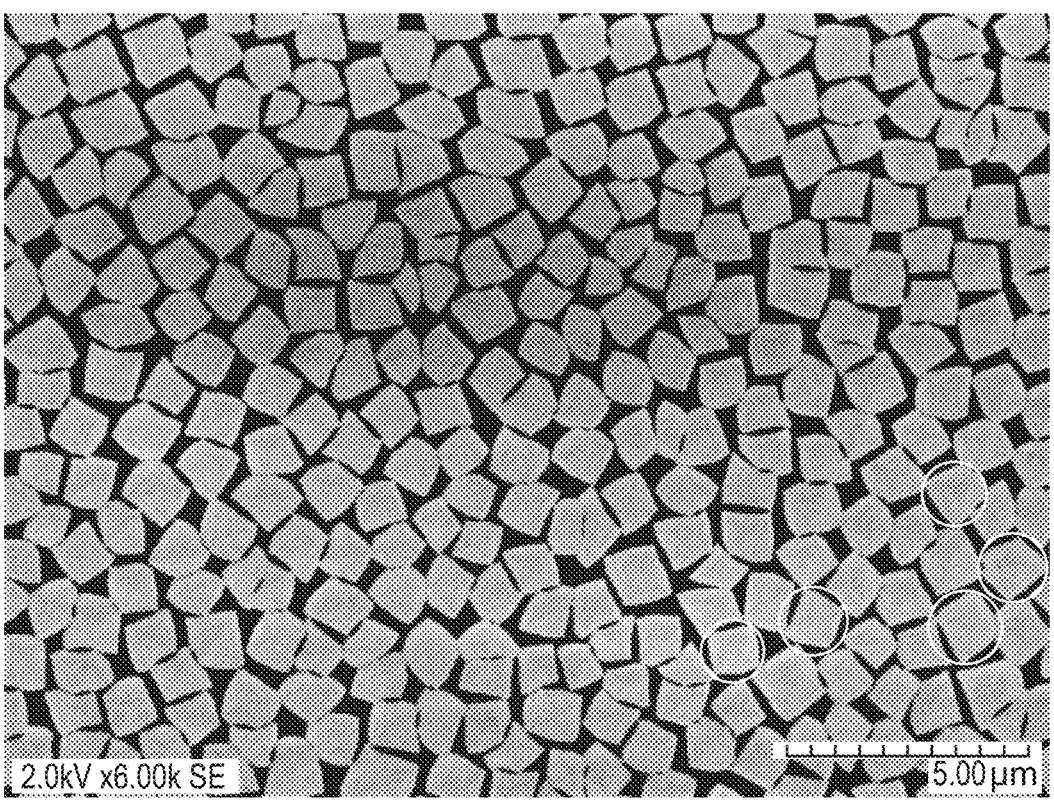
FIG. 4 is a view showing an observation image of a surface of a scintillator according to a comparative example of the embodiment of the present invention.

FIG. 3 shows an SEM image of a surface of the scintillator 101 when vapor deposition is performed with addition of an additive element. FIG. 4 shows an SEM image of a surface of the scintillator 101 when vapor deposition is performed without addition of any additive element. Adding an additive can reduce the thickness of each needle-like crystal of the scintillator 101 and improve the resolving power. In addition, each ellipse surrounded by the white line in FIGS. 3 and 4 indicates the ellipse 202 of each needle-like crystals of the scintillator 101 shown in FIG. 2 which has the smallest area and encloses the plane 201 parallel to the surface 108 of the substrate 102.

The evaluations of the resolving power characteristics of the scintillator 101 can be quantitatively compared by measuring MTFs (Modulation Transfer Functions). The luminance characteristics of the scintillator 101 can be evaluated by using photodetectors including various types of light-receiving elements and cameras, such as a CCD (charge-coupled device) and a CMOS (Complementary Metal-Oxide Semiconductor). The chemical composition of the additive element contained in the scintillator 101, such as the concentration of the additive element, can be evaluated by, for example, X-ray fluorescence spectrometric analysis or inductively coupled plasma spectrometry. The crystallinity of the scintillator 101 can be evaluated by, for example, X-ray diffraction analysis.

The next will describe the temperature of the substrate 102 when the scintillator 101 is deposited by vapor deposition. In order to reduce the thickness (diameter) of each needle-like crystal, it is important that the temperature of the substrate 102 at the time of vapor deposition is low in an early stage of deposition in consideration of the surface diffusion length of vapor-deposited particles reaching the surface of the substrate 102 on which deposition is performed. As indicated by the examples and comparative examples described later, the substrate temperature at the start of vapor deposition may be 100° C. or less. In addition, the substrate temperature at the start of vapor deposition may be 70° C. or less. If the temperature of the substrate 102 in an early stage of vapor deposition becomes higher than 130° C., the surface diffusion length of vapor-deposited particles increases. For this reason, the intervals between initial nuclei increase, and the crystal size of each needle-like crystal increases on the second surface 107 side of the scintillator 101, as indicated by the comparative examples described later. This may disturb the crystal structure or fail to maintain the gaps between the needle-like crystals. As a result, satisfactory resolving power characteristics cannot be obtained.

In contrast, if the temperature of the substrate 102 is low at the time of growth of needle-like crystals of the scintillator 101, an activator agent serving as an emission center may not be sufficiently activated from the viewpoint of luminance characteristics. If, for example, the temperature of the substrate 102 at the time of growth of the needle-like crystals of the scintillator 101 is as low as 40° C. or less, the width (diameter) of each needle-like crystal of the scintillator 101 extremely decreases, resulting in an excessive increase in the surface area of the scintillator 101. The alkali metal halide compound as the base material of the scintillator 101 exhibits deliquescent characteristics. Accordingly, as the surface area increases, protection using a protective film for moisture proof (to be described later) becomes imperfect. This makes it more difficult to prevent the moisture deterioration of the scintillator 101. If the protection of the scintillator 101 is imperfect, the deliquescent characteristics of the scintillator 101 will fuse the respective needle-like crystals. This may lead to a decrease in resolving power.

Accordingly, in this embodiment, depositing the scintillator 101 by vapor deposition upon setting the temperature of the substrate 102 to a temperature between 50° C. and 200° C. can prevent moisture deterioration while thinning each needle-like crystal. In other words, the substrate temperature may be 100° C. or less at the start of vapor deposition and may be 50° C. or more and 200° C. or less at the end of vapor deposition. In addition, the substrate temperature at the end of vapor deposition may be 70° C. or more and 150° C. or less. Assume that emission luminance is insufficient. In this case, after vapor deposition is started, an activator agent serving as an emission center is activated by raising the temperature of the substrate 102 to a degree that does not cause degradation of the needle-like crystal structure in a later stage of deposition. This can improve the emission luminance. In addition, for example, after a vapor deposition step, the substrate 102 on which the scintillator 101 is formed is subjected to heat treatment in the deposition apparatus 110 or moved from the deposition apparatus 110 to an external apparatus to be subjected to heat treatment at a temperature of 200° C. or less. This makes it possible to maintain high resolving power and luminance characteristics while maintaining the needle-like crystal structure.

The scintillator 101 exhibits deliquescent characteristics as described above, and hence a protective film for moisture proof of the needle-like crystals of the scintillator 101 is formed so as to cover the scintillator 101. For example, a parylene, fluorine resin, or TEOS film can be used as this protective film. These protective films can be formed by various types of coating methods such as a spray method, a coating method, and a CVD method. For example, after the scintillator plate 100 having the scintillator 101 formed on the substrate 102 is removed from the deposition apparatus 110, a protective film using parylene covering the scintillator 101 may be immediately deposited by using the spray method.

The examples and comparative examples of this embodiment will be described below. FIG. 6 shows a summary of the characteristics of scintillators 101 according to the examples and comparative examples described below. The comparative examples will be described first.

First Comparative Example

In the first comparative example, a scintillator 101 having a needle-like crystal structure was formed by using the deposition apparatus 110 shown in FIG. 1, using cesium iodide as a base material and thallium iodide as an activator agent. First of all, a material supply source 103a filled with cesium iodide as a vapor deposition material 104a, a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the temperature and rotational speed of the substrate 102 were respectively set to 40° C. and 30 rpm. The shutters were closed before the vapor deposition materials 104a and 104b were consumed while checking the state of deposition, thus finishing the deposition of the scintillator 101. After the substrate 102 and the material supply sources 103a and 103b were cooled to room temperature, the substrate 102 was removed and observed with an SEM to confirm that a needle-like crystal group was formed. The film thickness of the obtained scintillator 101 was 837 μm. The thickness of the largest portion of each needle-like crystal of the scintillator 101 in a plane parallel to a surface 108 of the substrate 102 was 1.7 μm. The thickness of each needle-like crystal of the scintillator 101 in an early stage of deposition in a plane parallel to the surface 108 of the substrate 102 at a height of 10 μm in the direction from a first surface 106 to a second surface 107 was 1.2 μm. According to the above results, the increase ratio of each needle-like crystal of the scintillator 101 was about 1.4 times. In this case, at a height of 10 μm in the direction from the first surface 106 of the scintillator 101 to the second surface 107, the scintillator 101 grew in a needle-like shape from initial nuclei into needle-like crystals. In addition, as shown in FIG. 2, the thickness of each needle-like crystal of the scintillator 101 was measured by measuring a major axis 204 of an ellipse 202 of the needle-like crystal of the scintillator 101 which has the smallest area and encloses a plane 201 parallel to the surface 108 of the substrate 102. The same applied to each example and each comparative example described below.

The second surface 107 of the scintillator 101 was placed in tight contact with a CMOS photodetector through an FOP (Fiber Optic Plate), and the photodetector was irradiated with X-rays complying with radiation quality RQA5 defined in the international Electrotechnical Commission from the substrate 102 side. The luminance value obtained at this time was defined as 100 and relatively compared with each corresponding value in each example and each comparative example. In addition, a value whose spatial frequency corresponding to 2 line pairs per mm (2 LP/mm) was obtained as an MTF value that is an index indicating the resolving power of the scintillator by an edge method using a knife edge made of tungsten. The MTF value obtained at this time was defined as 100 and relatively compared with each corresponding value in each example and each comparative example.

Second Comparative Example

In the second comparative example, a scintillator 101 having a needle-like crystal structure was formed by using the deposition apparatus 110 shown in FIG. 1, using cesium iodide as a base material and thallium iodide as an activator agent. First of all, a material supply source 103a filled with cesium iodide as a vapor deposition material 104a, a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the temperature and rotational speed of the substrate 102 were respectively set to 130° C. and 30 rpm. The shutters were closed before the vapor deposition materials 104a and 104b were consumed while checking the state of deposition, thus finishing the deposition of the scintillator 101. After the substrate 102 and the material supply sources 103a and 103b were cooled to room temperature, the substrate 102 was removed and observed with an SEM to confirm that needle-like crystal groups were formed. The film thickness of the obtained scintillator 101 was 853 µm. The thickness of the largest portion of each needle-like crystal of the scintillator 101 in a plane parallel to a surface 108 of the substrate 102 was 9.5 µm. The thickness of each needle-like crystal of the scintillator 101 in an early stage of deposition in a plane parallel to the surface 108 of the substrate 102 at a height of 10 µm in the direction from a first surface 106 to a second surface 107 was 1.0 µm. Accordingly, the increase ratio of each needle-like crystal of the scintillator 101 was about 9.5 times.

The second surface 107 of the scintillator 101 was placed in tight contact with a CMOS photodetector through an FOP, and the photodetector was irradiated with X-rays complying with radiation quality RQA5 from the substrate 102 side. The obtained luminance value was 129 in comparison with the first comparative example. In addition, the MTF value as an index indicating the resolving power of the scintillator was 89 in comparison with the first comparative example.

In this comparative example, the temperature of the substrate 102 at the time of deposition of the scintillator 101 by vapor deposition was made higher than that in the first comparative example described above to activate an activator agent serving as an emission center, thereby improving luminance. However, because the temperature in an early stage of crystal growth was high, each needle-like crystal on the second surface 107 of the scintillator 101 greatly grew in a direction parallel to a surface 108 of the substrate 102. As a result, the increase ratio of each needle-like crystal of the scintillator 101 was 9.5 times, which was higher than 9 times, resulting in a deterioration in resolving power characteristics as compared with the first comparative example described above.

Third Comparative Example

In the third comparative example, a scintillator 101 having a needle-like crystal structure was formed by using the deposition apparatus 110 shown in FIG. 1, using cesium iodide as a base material and thallium iodide as an activator agent. First of all, a vapor deposition material was prepared by mixing cesium iodide with copper iodide (CuI) as an additive element material in an amount of 0.2 wt % with respect to the cesium iodide and charged into a material supply source 103a. The material supply source 103a and a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the temperature and rotational speed of the substrate 102 were respectively set to 40° C. and 30 rpm. The shutters were closed before the vapor deposition materials 104a and 104b were consumed while checking the state of deposition, thus finishing the deposition of the scintillator 101. After the substrate 102 and the material supply sources 103a and 103b were cooled to room temperature, the substrate 102 was removed and observed with an SEM to confirm that needle-like crystal groups were formed. The film thickness of the obtained scintillator 101 was 764 µm. The thickness of the largest portion of each needle-like crystal of the scintillator 101 in a plane parallel to a surface 108 of the substrate 102 was 0.40 µm. The thickness of each needle-like crystal of the scintillator 101 in an early stage of deposition in a plane parallel to the surface 108 of the substrate 102 at a height of 10 µm in the direction from a first surface 106 to a second surface 107 was 0.16 µm. Accordingly, the increase ratio of each needle-like crystal of the scintillator 101 was 2.5 times.

The scintillator 101 was peeled off from the substrate 102, and the concentration of copper contained in the scintillator 101 was measured by X-ray fluorescence spectrometric analysis. The concentration of copper was 2.24 mol % in the first surface 106 facing the substrate 102 of the scintillator 101, and 1.22 mol % in the second surface 107. It was found that the concentration of the additive element contained in the first surface 106 as a surface on the opposite side to the second surface 107 of the scintillator 101 was higher than that contained in the second surface 107. In addition, the concentration of the additive element gradually increased from the second surface 107 of the scintillator 101 to the first surface 106.

The second surface 107 of the scintillator 101 was placed in tight contact with a CMOS photodetector through an FOP, and the photodetector was irradiated with X-rays complying with radiation quality RQA5 from the substrate 102 side. The obtained luminance value was 9.5 in comparison with the first comparative example. In addition, the MTF value as an index indicating the resolving power of the scintillator was 131 in comparison with the first comparative example.

In this comparative example, adding copper as an additive element to the scintillator 101 made it possible to greatly reduce the thickness of each needle-like crystal as compared with the first and second comparative examples described above. Accordingly, the resolving power improved as compared with the first and second comparative examples described above. On the other hand, the concentration of the additive element was as high as 1.22 mol % on the obverse surface side of the scintillator 101, and the scintillator 101 was colored by the additive element. As a consequence, the luminance value greatly decreased as compared with the first and second comparative examples described above.

Fourth Comparative Example

In the fourth comparative example, a scintillator 101 having a needle-like crystal structure was formed by using the deposition apparatus 110 shown in FIG. 1, using cesium iodide as a base material and thallium iodide as an activator agent. First of all, a vapor deposition material was prepared by mixing cesium iodide with copper iodide (CuI) as an additive element material in an amount of 0.2 wt % with respect to the cesium iodide and charged into a material supply source 103a. The material supply source 103a and a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the temperature and rotational speed of the substrate 102 were respectively set to 130° C. and 30 rpm. The shutters were closed before the vapor deposition materials 104a and 104b were consumed while checking the state of deposition, thus finishing the deposition of the scintillator 101. After the substrate 102 and the material supply sources 103a and 103b were cooled to room temperature, the substrate 102 was removed and observed with an SEM to confirm that needle-like crystal groups were formed. The film thickness of the obtained scintillator 101 was 556 μm. The thickness of the largest portion of each needle-like crystal of the scintillator 101 in a plane parallel to a surface 108 of the substrate 102 was 40 μm. The thickness of each needle-like crystal of the scintillator 101 in an early stage of deposition in a plane parallel to the surface 108 of the substrate 102 at a height of 10 μm in the direction from a first surface 106 to a second surface 107 was 1.0 μm. Accordingly, the increase ratio of each needle-like crystal of the scintillator 101 was 40 times.

The scintillator 101 was peeled off from the substrate 102, and the concentration of copper contained in the scintillator 101 was measured by X-ray fluorescence spectrometric analysis. The concentration of copper was 0.17 mol % in the second surface 107 of the scintillator 101.

The second surface 107 of the scintillator 101 was placed in tight contact with a CMOS photodetector through an FOP, and the photodetector was irradiated with X-rays complying with radiation quality RQA5 from the substrate 102 side. The obtained luminance value was 120 in comparison with the first comparative example. In addition, the MTF value as an index indicating the resolving power of the scintillator was 45 in comparison with the first comparative example.

In this comparative example, because the temperature of the substrate 102 at the time of deposition of the scintillator 101 by vapor deposition was higher than that in the third comparative example, thallium as an activator agent serving as an emission center was activated, thereby improving the luminance. However, because the temperature in an early stage of crystal growth was high, needle-like crystals grew on the second surface 107 of the scintillator 101 in a direction parallel to the surface 108 of the substrate 102. Consequently, the increase ratio of each needle-like crystal of the scintillator 101 became as large as 40 times, resulting in noticeable deterioration in resolving power.

First Example

The four examples of this embodiment will be described below. In the first example, a scintillator 101 having a needle-like crystal structure was formed by using the deposition apparatus 110 shown in FIG. 1, using cesium iodide as a base material and thallium iodide as an activator agent. First of all, a vapor deposition material was prepared by mixing cesium iodide with copper iodide (CuP as an additive element material in an amount of 0.2 wt % with respect to the cesium iodide and charged into a material supply source 103a. The material supply source 103a and a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the temperature and rotational speed of the substrate 102 were respectively set to 70° C. and 30 rpm. The shutters were closed before the vapor deposition materials 104a and 104b were consumed while checking the state of deposition, thus finishing the deposition of the scintillator 101.

After the deposition of the scintillator 101 by vapor deposition, the scintillator plate 100 including the scintillator 101 and the substrate 102 was heat-treated at 200° C. or less. More specifically, the substrate 102 was heat-treated by being heated to 150° C. by a lamp heating device (not shown) arranged in the deposition apparatus 110. The substrate 102 and the material supply sources 103a and 103b were cooled to room temperature after the heat treatment, and the substrate 102 was removed. The scintillator 101 was then observed with an SEM to confirm that a needle-like crystal group was formed. The film thickness of the obtained scintillator 101 was 795 μm. The thickness of the largest portion of each needle-like crystal of the scintillator 101 in a plane parallel to a surface 108 of the substrate 102 was 2.1 μm. The thickness of each needle-like crystal of the scintillator 101 in an early stage of deposition in a plane parallel to the surface 108 of the substrate 102 at a height of 10 μm in the direction from a first surface 106 to a second surface 107 was 0.30 μm. Accordingly, the increase ratio of each needle-like crystal of the scintillator 101 was about 7.0 times.

The scintillator 101 was peeled off from the substrate 102, and the concentration of copper contained in the scintillator 101 was measured by X-ray fluorescence spectrometric analysis. The concentration of copper was 0.28 mol % in the second surface 107 of the scintillator 101.

The second surface 107 of the scintillator 101 was placed in tight contact with a CMOS photodetector through an FOP, and the photodetector was irradiated with X-rays complying with radiation quality RQA5 from the substrate 102 side. The obtained luminance value was 129 in comparison with the first comparative example. In addition, the MTF value as an index indicating the resolving power of the scintillator was 133 in comparison with the first comparative example.

In this example, a proper amount of copper as an additive element was added to cesium iodide. In addition, the temperature of the substrate 102 at the start of deposition of the scintillator 101 by vapor deposition and the temperature of the substrate 102 during and at the end of vapor deposition were respectively controlled to proper temperatures. After the vapor deposition, the scintillator 101 was heat-treated at a proper temperature. It was found that the scintillator 101 formed in this process achieved high resolving power and improved luminance.

Second Example

In the second example, a scintillator 101 having a needle-like crystal structure was formed by using the deposition apparatus 110 shown in FIG. 1, using cesium iodide as a base material and thallium iodide as an activator agent. First of all, a vapor deposition material was prepared by mixing cesium iodide with copper iodide (CuI) as an additive element material in amount of 0.2 wt % with respect to the cesium iodide and charged into a material supply source 103a. The material supply source 103a and a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the temperature and rotational speed of the substrate 102 were respectively set to 70° C. and 30 rpm. The shutters were closed before the vapor deposition materials 104a and 104b were consumed while checking the state of deposition, thus finishing the deposition of the scintillator 101.

After deposition of the scintillator 101 by vapor deposition, the substrate 102 on which the scintillator 101 was deposited was removed from the deposition apparatus 110 and heat-treated in a nitrogen atmosphere at 160° C. by using an infrared anneal furnace (not shown). After the heat treatment, the substrate 102 was cooled to room temperature and removed. The scintillator 101 was then observed with an SEM to confirm that a needle-like crystal group was formed. The film thickness of the obtained scintillator 101 was 777 μm. The thickness of the largest portion of each needle-like crystal of the scintillator 101 in a plane parallel to a surface 108 of the substrate 102 was 3.5 μm. The thickness of each needle-like crystal of the scintillator 101 in an early stage of deposition in a plane parallel to the surface 108 of the substrate 102 at a height of 10 μm in the direction from a first surface 106 to a second surface 107 was 0.40 μm. Accordingly, the increase ratio of each needle-like crystal of the scintillator 101 was about 8.8 times.

The scintillator 101 was peeled off from the substrate 102, and the concentration of copper contained in the scintillator 101 was measured by X-ray fluorescence spectrometric analysis. The concentration of copper was 0.24 mol % in the second surface 107 of the scintillator 101.

A surface of the scintillator 101 was placed in tight contact with a CMOS photodetector through an FOP, and the photodetector was irradiated with X-rays complying with radiation quality RQA5 from the substrate 102 side. The obtained luminance value was 155 in comparison with the first comparative example. In addition, the MTF value as an index indicating the resolving power of the scintillator was 137 in comparison with the first comparative example.

In this example, as in the first example described above, a proper amount of copper as an additive was added to cesium iodide. In addition, the substrate temperature at the start of vapor deposition and the substrate temperature during and at the end of vapor deposition were respectively controlled to proper temperatures. After the vapor deposition, the scintillator 101 was heat-treated at a proper temperature. It was found that the scintillator 101 formed in this process achieved high resolving power and improved luminance.

Third Example

In the third example, a scintillator 101 having a needle-like crystal structure was formed by using the deposition apparatus 110 shown in FIG. 1, using cesium iodide as a base material and thallium iodide as an activator agent. First of all, a vapor deposition material was prepared by mixing cesium iodide with copper iodide (CuI) as an additive element material in amount of 0.2 wt % with respect to the cesium iodide and charged into a material supply source 103a. The material supply source 103a and a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the rotational speed of the substrate 102 was set to 30 rpm. The shutters were closed before the vapor deposition materials 104a and 104b were consumed while checking the state of deposition, thus finishing the deposition of the scintillator 101.

In this example, unlike in each example and each comparative example described above, although the temperature of the substrate 102 was not specifically controlled, a heat-sensitive tape bonded to the substrate after deposition indicated that the achieved temperature was about 150° C. That is, the temperature of the substrate 102 is room temperature at the start of vapor deposition, but when vapor deposition starts, the substrate 102 is heated to 150° C. upon transfer of heat from the material supply sources 103a and 103b to the substrate 102. As a result, deposition of the scintillator 101 may have been performed at or near 150° C. after the formation of initial nuclei in an early stage of deposition. In this case, room temperature can be 10° C. or more and 30° C. or less, or can be 15° C. or more and 25° C. or less, or can be, for example, 300K (27° C.).

After the substrate 102 and the material supply sources 103a and 103b were cooled to room temperature, the substrate 102 was removed and observed with an SEM to confirm that a needle-like crystal group was formed. The film thickness of the obtained scintillator 101 was 513 μm. The thickness of the largest portion of each needle-like crystal of the scintillator 101 in a plane parallel to a surface 108 of the substrate 102 was 2.2 μm. The thickness of each needle-like crystal of the scintillator 101 in an early stage of deposition in a plane parallel to the surface 108 of the substrate 102 at a height of 10 μm in the direction from a first surface 106 to a second surface 107 was 0.30 μm. Accordingly, the increase ratio of each needle-like crystal of the scintillator 101 was about 7.3 times.

The scintillator 101 was peeled off from the substrate 102, and the concentration of copper contained in the scintillator 101 was measured by X-ray fluorescence spectrometric analysis. The concentration of copper was 0.04 mol % in the second surface 107 of the scintillator 101.

The second surface 107 of the scintillator 101 was placed in tight contact with a CMOS photodetector through an FOP, and the photodetector was irradiated with X-rays complying with radiation quality RQA5 from the substrate 102 side. The obtained luminance value was 143 in comparison with the first comparative example. In addition, the MTF value as an index indicating the resolving power of the scintillator was 135 in comparison with the first comparative example.

In this example, a proper amount of copper as an additive was added to cesium iodide. In addition, the temperature of the substrate 102 at the start of vapor deposition and the temperature of the substrate 102 during and at the end of vapor deposition were respectively controlled to proper temperatures. It was found that the scintillator 101 formed in this process achieved high resolving power and improved luminance.

Fourth Example

In the fourth example, a scintillator 101 having a needle-like crystal structure was formed by using the deposition apparatus 110 shown in FIG. 1, using cesium iodide as a base material and thallium iodide as an activator agent. First of all, a vapor deposition material was prepared by mixing cesium iodide with silver iodide (AgI) as an additive element material in an amount of 0.25 wt % with respect to the cesium iodide and charged into a material supply source 103a. The material supply source 103a and a material supply source 103b filled with thallium iodide as a vapor deposition material 104b, and a substrate 102 were arranged in the deposition apparatus 110. The substrate 102 used in this case was obtained by stacking an aluminum reflecting layer having a thickness of 100 nm and a silicon dioxide layer having a thickness of 50 nm on a silicon substrate. As the material supply sources 103a and 103b, cylindrical material supply sources made of tantalum were used.

After the deposition apparatus 110 was evacuated to 0.01 Pa or less, currents were gradually supplied to the material supply sources 103a and 103b to heat them. When the temperatures of the material supply sources 103a and 103b reached set temperatures, shutters (not shown) provided between the substrate 102 and the material supply sources 103a and 103b were opened to start deposition of the scintillator 101 by vapor deposition. At this time, the rotational speed of the substrate 102 was set to 30 rpm. The shutters were closed before the vapor deposition materials 104a and 104b were consumed while checking the state of deposition, thus finishing the deposition of the scintillator 101. In this example, as in the third example, the temperature of the substrate 102 is not specifically controlled.

After the substrate 102 and the material supply sources 103a and 103b were cooled to room temperature, the substrate 102 was removed and observed with an SEM to confirm that a needle-like crystal group was formed. The film thickness of the obtained scintillator 101 was 464 µm. The thickness of the largest portion of each needle-like crystal of the scintillator 101 in a plane parallel to a surface 108 of the substrate 102 was 3.0 µm. The thickness of each needle-like crystal of the scintillator 101 in an early stage of deposition in a plane parallel to the surface 108 of the substrate 102 at a height of 10 µm in the direction from a first surface 106 to a second surface 107 was 0.58 µm. Accordingly, the increase ratio of each needle-like crystal of the scintillator 101 was about 5.2 times.

The scintillator 101 was peeled off from the substrate 102, and the concentration of copper contained in the scintillator 101 was measured by X-ray fluorescence spectrometric analysis. The concentration of copper was 0.42 mol % in the second surface 107 of the scintillator 101.

The second surface 107 of the scintillator 101 was placed in tight contact with a CMOS photodetector through an FOP, and the photodetector was irradiated with X-rays complying with radiation quality RQA5 from the substrate 102 side. The MTF value as an index indicating the resolving power of the obtained scintillator was 163 in comparison with the first comparative example.

In this example, a proper amount of copper as an additive element was added to cesium iodide. In addition, the temperature of the substrate 102 at the start of vapor deposition and the temperature of the substrate 102 during and at the end of vapor deposition were respectively controlled to proper temperatures. It was found that the scintillator 101 formed in this process allowed the miniaturization of the diameter of each needle-like crystal and hence achieved high resolving power even with the use of sliver as an additive element.

In this embodiment and each example, the scintillator 101 is formed from needle-like crystals obtained by using cesium iodide, which is an alkali metal halide compound, as a base material and thallium iodide as an activator agent, and contains at least one of additive elements including copper and silver. At this time, the second surface 107 of the scintillator 101 contains the additive element at a concentration of 0.04 mol % or more and 0.5 mol % or less. In addition, the scintillator 101 is formed so as to make the concentration of the additive element higher in the first surface 106 of the scintillator 101 than in the second surface 107. A vapor deposition material to deposit the scintillator 101 is prepared by mixing cesium iodide as an alkali metal halide compound with an additive element in an amount of 0.1 wt % or more and 0.3 wt % or less with respect to the cesium iodide. The temperature of the substrate 102 at the start of deposition of the scintillator 101 using this vapor deposition material is set to 100° C. or less, and the temperature of the substrate 102 at the end of vapor deposition is set to 50° C. or more and 200° C. or less. In each example described above, the temperature of the substrate 102 during and at the end of vapor deposition is set to 70° C. or more and 150° C. or less. With this process, the scintillator 101 is deposited such that the thickness of the largest portion of each needle-like crystal in a plane parallel to the surface 108 of the substrate 102 becomes one or more times and nine or less times the thickness of the needle-like crystal in a plane parallel to the surface 108 of the substrate 102 at a height of 10 µm from the first surface 106. In addition, at this time, the scintillator 101 is deposited such that the thickness of the largest portion of each needle-like crystal is 4 µm or less. This enables the scintillator 101 to have high resolving power and improve luminance, thereby satisfying both the requirements for resolving power (resolution) and luminance.

The above means provide a technique advantageous in improving the resolution and luminance characteristic of a scintillator.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A scintillator plate provided with a scintillator having, on a surface of a substrate, a first surface facing the surface and a second surface on an opposite side to the first surface,
   wherein the scintillator includes a plurality of needle-shaped crystals, each containing an alkali metal halide compound as a base material, thallium iodide as an activator agent, and at least one of copper and silver as an additive element,
   wherein the additive element is contained in the second surface at a concentration of not less than 0.04 mol % and not more than 0.5 mol %,
   wherein the additive element has a higher concentration in the first surface than in the second surface, and
   wherein a thickness of a largest portion of each needle-shaped crystal of the needle-shaped crystals in a plane parallel to the surface becomes not less than one time and not more than nine times a thickness of the needle-shaped crystal in a plane parallel to the surface at a height of 10 μm in a direction from the first surface to the second surface.

2. The scintillator plate according to claim 1, wherein the thickness of the largest portion of the needle-shaped crystal is not more than 4 μm.

3. The scintillator plate according to claim 1, wherein the alkali metal halide compound is cesium iodide.

4. The scintillator plate according to claim 1, wherein the concentration of the additive element continuously or stepwisely increases from the second surface to the first surface.

5. The scintillator plate according to claim 1, wherein the thickness is a length of a major axis of an ellipse of the needle-shaped crystal which has a smallest area and encloses a plane parallel to the surface.

6. A radiation imaging apparatus comprising:
   a scintillator plate according to claim 1; and
   a sensor panel configured to receive light emitted from the scintillator.

7. The radiation imaging apparatus according to claim 6, wherein the scintillator plate is provided with the scintillator alongside a light-receiving surface of the sensor panel and the substrate on a side away from the light-receiving surface.

8. A method of manufacturing a scintillator plate, the method comprising:
   a preparation step of preparing a vapor deposition material by mixing cesium iodide with an additive element material in an amount of not less than 0.1 wt % and not more than 0.3 wt % with respect to the cesium iodide; and
   a vapor deposition step of forming a scintillator by vapor-depositing the vapor deposition material on a substrate,
   wherein the additive element material includes at least one of copper iodide, copper bromide, silver iodide, and silver bromide, and
   wherein, in the vapor deposition step, a temperature of the substrate at a time of starting vapor deposition is not more than 100° C., and a temperature of the substrate at a time of finishing the vapor deposition is not less than 50° C. and not more than 200° C.

9. The method according to claim 8, wherein in the vapor deposition step, the temperature of the substrate at the time of finishing the vapor deposition is not less than 70° C. and not more than 150° C.

10. The method according to claim 8, wherein in the vapor deposition step, vapor deposition of thallium iodide is performed together with the vapor deposition of the vapor deposition material.

11. The method according to claim 8, wherein after the vapor deposition step, the scintillator plate is heat-treated at not more than 200° C.

12. The method according to claim 8, wherein a melting point of the additive element material is lower than that of the cesium iodide.

* * * * *